United States Patent
Ng et al.

(10) Patent No.: US 8,418,020 B2
(45) Date of Patent: *Apr. 9, 2013

(54) LDPC SELECTIVE DECODING SCHEDULING USING A COST FUNCTION

(75) Inventors: Kin Man Ng, Tokwawan (HK); Lingqi Zeng, Turlock, CA (US); Yu Kou, San Jose, CA (US); Kwok W. Yeung, Milpitas, CA (US)

(73) Assignee: SK hynix memory solutions inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/490,947

(22) Filed: Jun. 7, 2012

(65) Prior Publication Data

US 2012/0246536 A1 Sep. 27, 2012

Related U.S. Application Data

(63) Continuation of application No. 12/587,012, filed on Sep. 29, 2009, now Pat. No. 8,219,873.

(60) Provisional application No. 61/196,634, filed on Oct. 20, 2008.

(51) Int. Cl.
  *H03M 13/00* (2006.01)

(52) U.S. Cl.
  USPC ........... 714/752; 714/746; 714/751; 714/799; 714/800

(58) Field of Classification Search ........................ None
See application file for complete search history.

(56) References Cited

U.S. PATENT DOCUMENTS

| | | | | |
|---|---|---|---|---|
| 2007/0245217 A1* | 10/2007 | Valle | ............................. | 714/758 |
| 2008/0028274 A1* | 1/2008 | Lin | ............... | 714/752 |
| 2008/0109708 A1* | 5/2008 | Kim et al. | ..................... | 714/790 |
| 2009/0222710 A1* | 9/2009 | Patapoutian et al. | ......... | 714/780 |
| 2009/0313525 A1* | 12/2009 | Savin et al. | ................... | 714/752 |
| 2010/0042891 A1* | 2/2010 | Gunnam et al. | .............. | 714/752 |
| 2010/0042897 A1* | 2/2010 | Han et al. | ..................... | 714/752 |

* cited by examiner

*Primary Examiner* — John Trimmings
(74) *Attorney, Agent, or Firm* — Van Pelt, Yi & James LLP

(57) ABSTRACT

A cost function is obtained. For each of a plurality of groups of check nodes associated with low-density parity-check (LDPC) encoded data, the cost function is evaluated using information associated with a variable node and/or information associated with a check node. One of the groups of check nodes is selecting based at least in part on the evaluated cost functions. Error correction decoding related processing is performed on the selected group of check nodes.

20 Claims, 11 Drawing Sheets

LDPC SELECTIVE DECODING SCHEDULING USING A COST FUNCTION

CROSS REFERENCE TO OTHER APPLICATIONS

This application is a continuation of co-pending U.S. patent application Ser. No. 12/587,012, entitled LDPC SELECTIVE DECODING SCHEDULING USING A COST FUNCTION filed Sep. 29, 2009 which claims priority to U.S. Provisional Patent Application No. 61/196,634 entitled LDPC SELECTIVE DECODING SCHEDULING AND EARLY DETERMINATION filed Oct. 20, 2008 which are incorporated herein by reference for all purposes.

BACKGROUND OF THE INVENTION

One example of a message passing process used in decoding low-density parity-check (LDPC) encoded data is as follows:

STEP1: For each variable node $v_j$, compute a hard decision $\hat{l}_j$ based on the channel information and the incoming messages from all the connected check nodes $c_i$. If the decisions $\hat{L}=(\hat{l}_0, \hat{l}_1, \ldots \hat{l}_{n-1})$ satisfy all the check nodes or a preset maximum number of iterations is reached, stop here. Otherwise, go to STEP2.

STEP2 (V-Node update): For each variable node $v_j$, compute an outgoing message to each connected check node $c_i$ based on the incoming messages from all the other connected check nodes $c_{i'}(i'\neq i)$. Go to STEP3.

STEP3 (C-Node update): For each check node $c_i$, compute the outgoing message to each connected variable node $v_j$ based on the incoming messages from all the other connected variable nodes $v_{j'}(j'\neq j)$. Go to STEP1.

The above message passing technique uses flooding scheduling. That is, all variable nodes are processed in parallel in STEP2, then all check nodes are processed in parallel in STEP3, and so on.

Some message-passing techniques use sequential scheduling, such as Horizontal Shuffle Scheduling (HSS) and Vertical Shuffle Scheduling (VSS). One example of a message passing process using HSS is defined as follows:

All the check nodes are sequentially divided into K groups, for example $\mathfrak{R}_1, \mathfrak{R}_2, \ldots, \mathfrak{R}_K$. Each group contains $r_1, r_2, \ldots, r_K$ check nodes, respectively, so that $$r_1+r_2+\ldots+r_K=m.$$

STEP1 (C-Node update): For each check node $c_i \in \mathfrak{R}_k$ (k is initialized to 0), compute the outgoing message to each connected variable node $v_j$ based on the incoming messages from all the other connected variable nodes $v_{j'}(j'\neq j)$. Go to STEP2.

STEP2 (V-Node update): For each variable node $v_j$ connected to any check node $c_i \in \mathfrak{R}_k$, compute its outgoing message to each connected check node $c_i$ based on the incoming messages from all the other connected check nodes $c_{i'}(i'\neq i)$.

STEP3: k=k+1. If k=K, go to STEP4; else go to STEP1.

STEP4: For each variable node $v_j$, compute the hard decision $\hat{l}_j$ based on the channel information and the incoming messages from all the connected check nodes $c_i$. If the decisions $\hat{L}=(\hat{l}_0, \hat{l}_1, \ldots, \hat{l}_{n-1})$ satisfy all the check nodes or a preset maximum number of iterations is reached, stop. Otherwise, k=0 and go to STEP1.

It would be desirable to develop techniques that improve the performance of decoding distorted LDPC encoded data. For example, it would be desirable if the processing time and/or the number of iterations (e.g., associated with message passing) could be reduced.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

Figure 1:
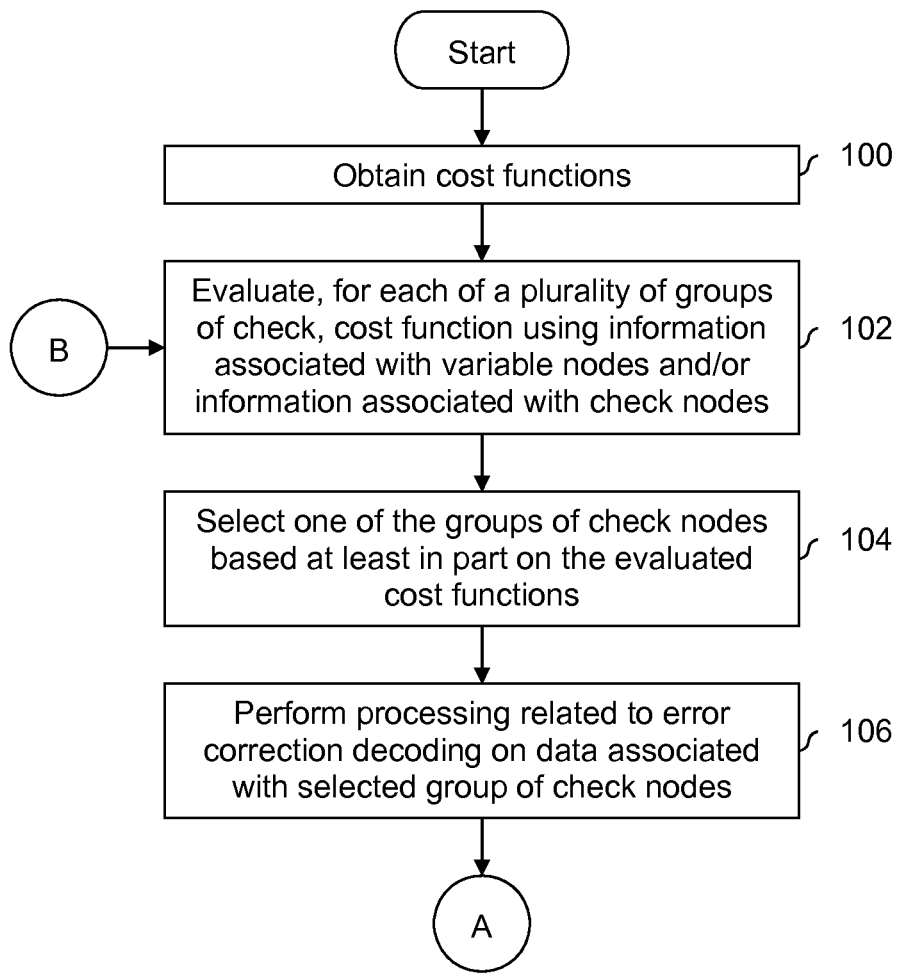
FIG. 1 is a flowchart illustrating an embodiment of a process for decoding data.

FIG. 1 is a flowchart illustrating an embodiment of a process for decoding data. In the example shown, distorted LDPC (low-density parity-check) encoded data is decoded. LDPC codes are a class of error correction codes. An LDPC code is defined as the null space of a sparse parity-check matrix H. An LDPC codeword $L=(l_0, l_1, \ldots, l_{n-1})$ is a vector in the null space which can satisfy all the check nodes of H. An LDPC code can achieve relatively good error performance by using a message passing algorithm (such as SPA (sum-product algorithm), min-sum, etc.).

The parity-check matrix H of an LDPC code is related to a bipartite graph, also referred to as a Tanner Graph. Given an m×n parity-check matrix H of an LDPC code, the nodes of the Tanner Graph G are divided into two sets of nodes, V and C. V contains n variable nodes $v_j$ (or left nodes), corresponding to the columns of H, and m check nodes $c_i$ (or right nodes), corresponding to the rows of H. A variable node $v_j$ is connected to a check node $c_i$ if and only if the corresponding entry $h_{i,j}$ of the parity-check matrix H is non-zero. The degree of a node in G is defined as the number of edges connected to it. The degree of a variable node is simply equal to the weight of its corresponding column of H, and the degree of a check node is simply equal to the weight of its corresponding row of H.

At 100, a cost function is obtained. In some embodiments, a cost function ($f$) receives as an input information associated with variable nodes, such as the distorted reliability value associated with each variable node and the updated message from the connected check nodes. In some embodiments, $f$ is a function of check nodes information, such as the number of unsatisfied check nodes within each group of check nodes. In some embodiments, a cost function is a function of both check nodes and variable nodes information. In some embodiments, a cost function will also include some special constraints (e.g., the same group of check nodes is never processed twice in the same iteration and/or the same group of check nodes is never processed consecutively even in the different iterations.).

A cost function is evaluated for each of a plurality of groups of check nodes using information associated with variable nodes and/or information associated with check nodes at 102. Some examples of specific cost functions are described in further detail below. One of the groups of check nodes is selected based at least in part on the evaluated cost functions at 104. For example, in some embodiments the group minimizing/maximizing the evaluated cost function is selected. If there is more than one group that minimizes the cost function, another cost function can be used to conduct the further selection. If there are still multiple groups remaining after evaluating all the cost functions, one of the groups is chosen arbitrarily in some embodiments.

At 106, processing related to error correction decoding is performed on data associated with the selected group of check nodes. In some embodiments this includes performing a check node update (e.g., by computing—for each check node in the selected group—an outgoing message to each connected variable node $v_j$ based on the incoming messages from all the other connected variable nodes $v_{j'}(j' \neq j)$) and a variable node update (e.g., by computing—for each variable node $v_j$ connected to any check node in the selected group—its outgoing message to each connected check node $c_i$ based on the incoming messages from all the other connected check nodes $c_{i'}(i' \neq i)$).

One benefit to using the technique described herein is that error correction decoding (at least in some cases) is completed in a shorter amount of time than some other techniques. For example, suppose there are m groups of check nodes, each group including a single check node. Compared to an HSS processing technique that always processes the groups of check nodes in the order Group 1, Group 2, . . . , Group m, the technique described herein may finish sooner. For example, if some error or noise remains in Group m (i.e., the last group to be processed by the HSS technique in an iteration) then the technique described herein will likely select and process data associated with Group m before the HSS technique does.

Figure 2:
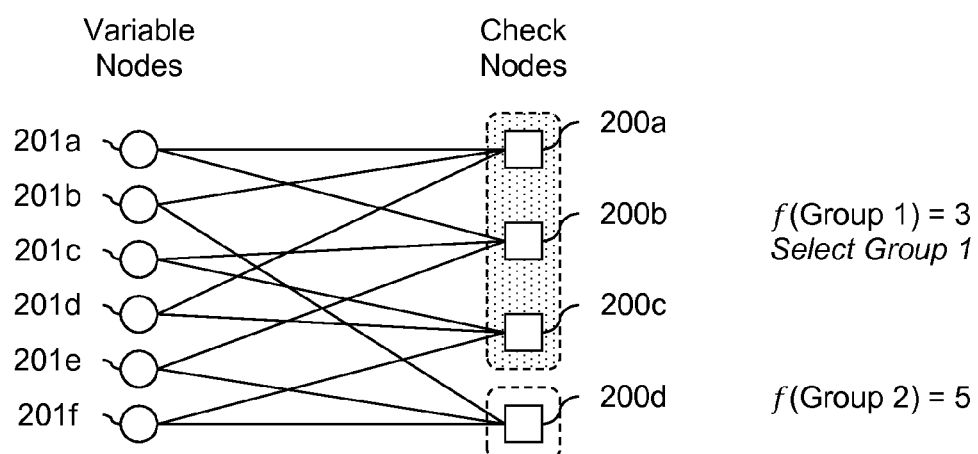
FIG. 2 is a diagram showing some embodiments of groups of check nodes.
Figure 2:
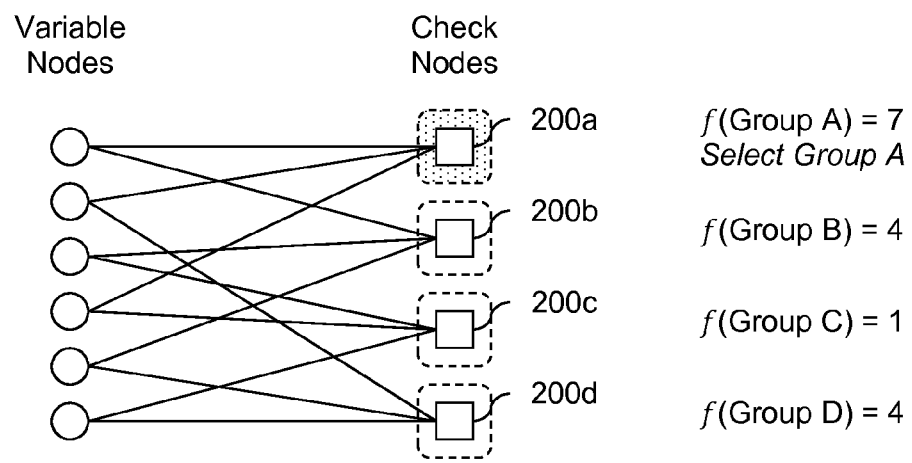

FIG. 2 is a diagram showing some embodiments of groups of check nodes. In the diagrams shown, the example process shown in FIG. 1 is used to select a group of check nodes using a cost function. In the first example shown (diagram 210), there are 6 variable nodes, each variable node of which is connected to 2 (out of 4 total) check nodes. Each of the 4 check nodes is in turn connected to 3 of the 6 total variable nodes. The connections control the propagation of information during error correction decoding of the distorted LDPC encoded data.

In diagram 210, the first group of check nodes (Group 1) includes 3 check nodes: 200a-200c. The second group of check nodes (Group 2) includes a single check node: 200d. For each group, a cost function is evaluated. For Group 1, the evaluated cost function has a value of 3. For Group 2, the evaluated cost function has a value of 5. In this example, the group with the lowest evaluated cost function is selected (that is, Group 1), and error correction processing is performed on equations or functions associated with the selected group (i.e., Group 1 in this example).

Diagram 220 shows the same variable nodes, check nodes, and connections as in diagram 210 with different groups of check nodes. In diagram 220, there are four groups, and each group includes a single check node. That is, Group A includes check node 200a, Group B includes check node 200b, Group C includes check node 200c, and Group D includes check node 200d.

For each of the 4 groups shown, a cost function is evaluated. The values of the evaluated cost function are 7, 4, 1, and 4, respectively. In this example, the group with the highest evaluated cost function is selected, and error correction decoding is performed on function(s)/equation(s) associated with Group A.

Using the selected groups shown in diagram 210, a more detailed example of check node updating (used in some embodiments at 106 in FIG. 1) is shown below. In diagram 210, the selected group includes check nodes 200a-200c. During check node updating, for each check node in the selected group, an outgoing message is determined to each connected variable node based on the incoming messages from all other connected variable nodes. Note that check node 200d is not included in the table below because it is not in the selected group.

TABLE 1

Check node update using diagram 210 as an example

|  | From check node 200a | From check node 200b | From check node 200c |
|---|---|---|---|
| To variable node 201a | Based on IN MSG from variable nodes 201b and 201d | Based on IN MSG from variable nodes 201c and 201e | None |
| To variable node 201b | Based on IN MSG from variable nodes 201a and 201d | None | None |
| To variable node 201c | None | Based on IN MSG from variable nodes 201a and 201e | Based on IN MSG from variable nodes 201d and 201f |
| To variable node 201d | Based on IN MSG from variable nodes 201a and 201b | None | Based on IN MSG from variable nodes 201c and 201f |
| To variable node 201e | None | Based on IN MSG from variable nodes 201a and 201c | None |
| To variable node 201f | None | None | Based on IN MSG from variable nodes 201c and 201d |

Using the selected groups shown in diagram 210, a more detailed example of variable node updating (used in some embodiments at 106 in FIG. 1) is shown below. In some embodiments, check node updating is performed first, and then variable node updating is performed. During variable node updating, for each variable node connected to a check node in the selected group (in this example, all of the variable nodes are connected to a check node in the selected group), an outgoing message is determined to be sent to a connected check node based on the incoming messages from all other connected check nodes.

TABLE 2

Variable node update using diagram 210 as an example

|  | To check node 200a | To check node 200b | To check node 200c | To check node 200d |
|---|---|---|---|---|
| From variable node 201a | Based on IN MSG from check node 200b | Based on IN MSG from check node 200a | None | None |
| From variable node 201b | Based on IN MSG from check node 200d | None | None | Based on IN MSG from check node 200a |
| From variable node 201c | None | Based on IN MSG from check node 200c | Based on IN MSG from check node 200b | None |
| From variable node 201d | Based on IN MSG from check node 200c | None | Based on IN MSG from check node 200a | None |
| From variable node 201e | None | Based on IN MSG from check node 200d | None | Based on IN MSG from check node 200b |
| From variable node 201f | None | None | Based on IN MSG from check node 200d | Based on IN MSG from check node 200c |

As shown in the above example, a group of check nodes can include one or more check nodes. In some embodiments, each group has the same number of check nodes (see, e.g., diagram 220); in other embodiments, the groups have different numbers of check nodes in them (see, e.g., diagram 210).

Figure 3:
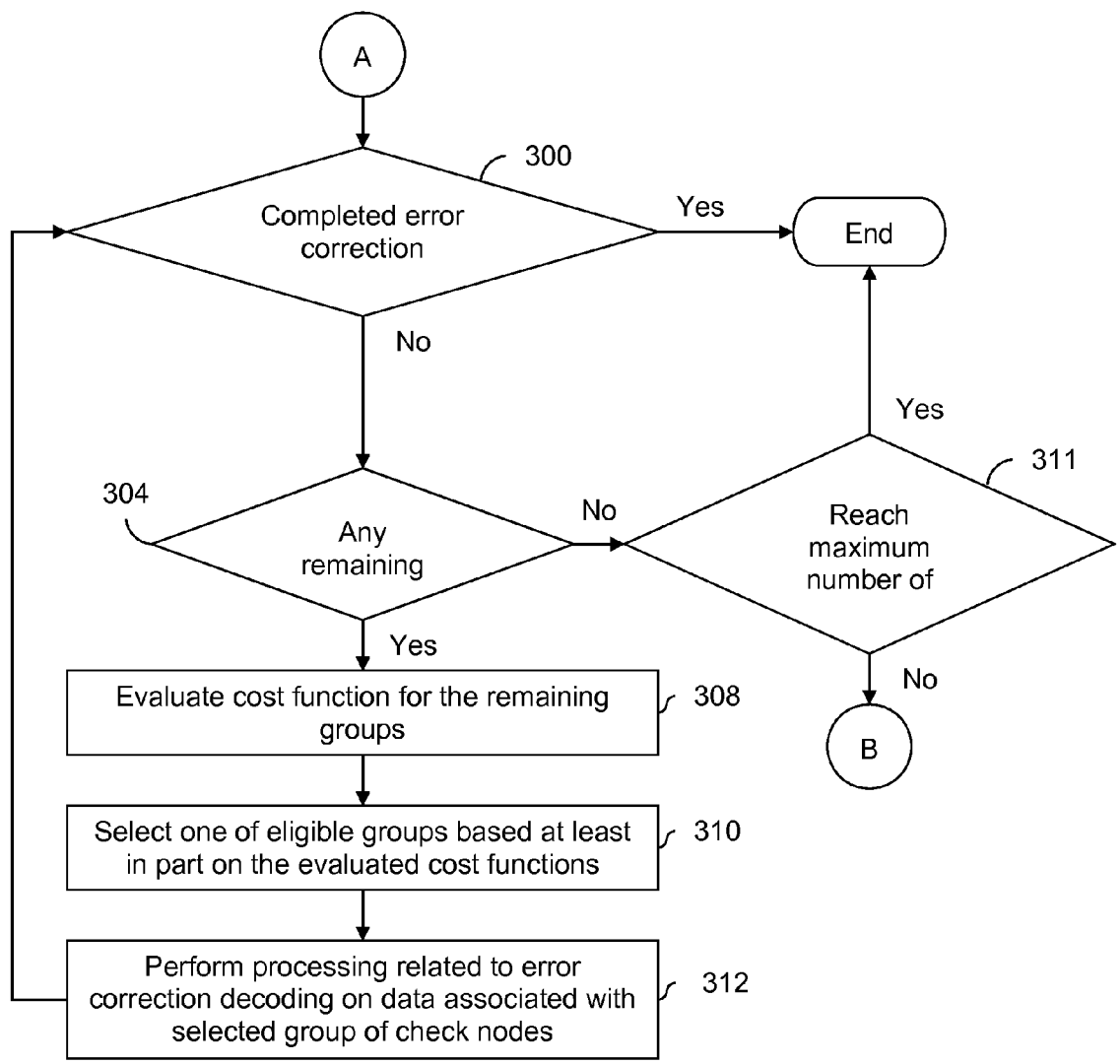
FIG. 3 is a flowchart illustrating an embodiment of a process for subsequent processing of distorted LDPC encoded data.

FIG. 3 is a flowchart illustrating an embodiment of a process for subsequent processing of distorted LDPC encoded data. In the example shown, the process shown in FIG. 1 continues. Some of the processing shown in this figure is/are similar to processing shown in FIG. 1. For example, both steps 102 and 308 evaluate a cost function, steps 104 and 310 select a group of check nodes based on an evaluated cost function, and steps 106 and 312 perform processing related to error correction decoding. In some embodiments, a (e.g., single) hardware component or other processor is used to perform similar steps in FIGS. 1 and 3.

At 300, it is determined if error correction decoding is completed. In some embodiments, this includes checking if all the parity checks are satisfied. In one example this includes computing the hard decision $\hat{I}_j$ for each variable node $v_j$ based on the channel information and the incoming messages from all the connected check nodes $c_i$. If the decisions $\hat{L}=(\hat{I}_0, \hat{I}_1, \ldots, \hat{I}_{n-1})$ satisfy all the check nodes, then error correction decoding is successful and the decoded data is output. In some embodiments, decoding ends if a (e.g., predefined) maximum number of iterations is reached. As used herein, an iteration includes (for x groups of check nodes) x selections. So, if there are x groups, there are x selections in a complete or full iteration. For example, in diagram 210 in FIG. 2, a full or complete iteration includes 2 selections (one for Group 1 and one for Group 2), and in diagram 220 a complete or full iteration includes 4 instances of selecting/processing (one each for Groups A-D).

It is determined at 304 if there are any remaining groups. For example, in diagram 210 in FIG. 2 if both Group 1 and Group 2 have been selected and processed then there are no remaining groups, at least during this iteration. If there are no remaining groups, the process will end the decoding if the pre-determined maximum number of iteration is reached at 311. If not, the process will evaluates cost functions at 102 in FIG. 1 (e.g., for all groups since a new iteration is starting). Otherwise (i.e., if there is at least one group remaining during a current iteration) a cost function is evaluated for the remaining groups at 308. In some embodiments, if there is only one group of check nodes remaining during an iteration, step 308 is skipped and the single remaining group is selected without evaluating a cost function. At 310, one of the remaining groups is selected based at least in part on the evaluated cost functions. Processing related to error correction decoding is performed on data associated with selected group of check nodes at 312.

The following figure applies the example processes described in FIGS. 1 and 3 to exemplary data.

Figure 4:
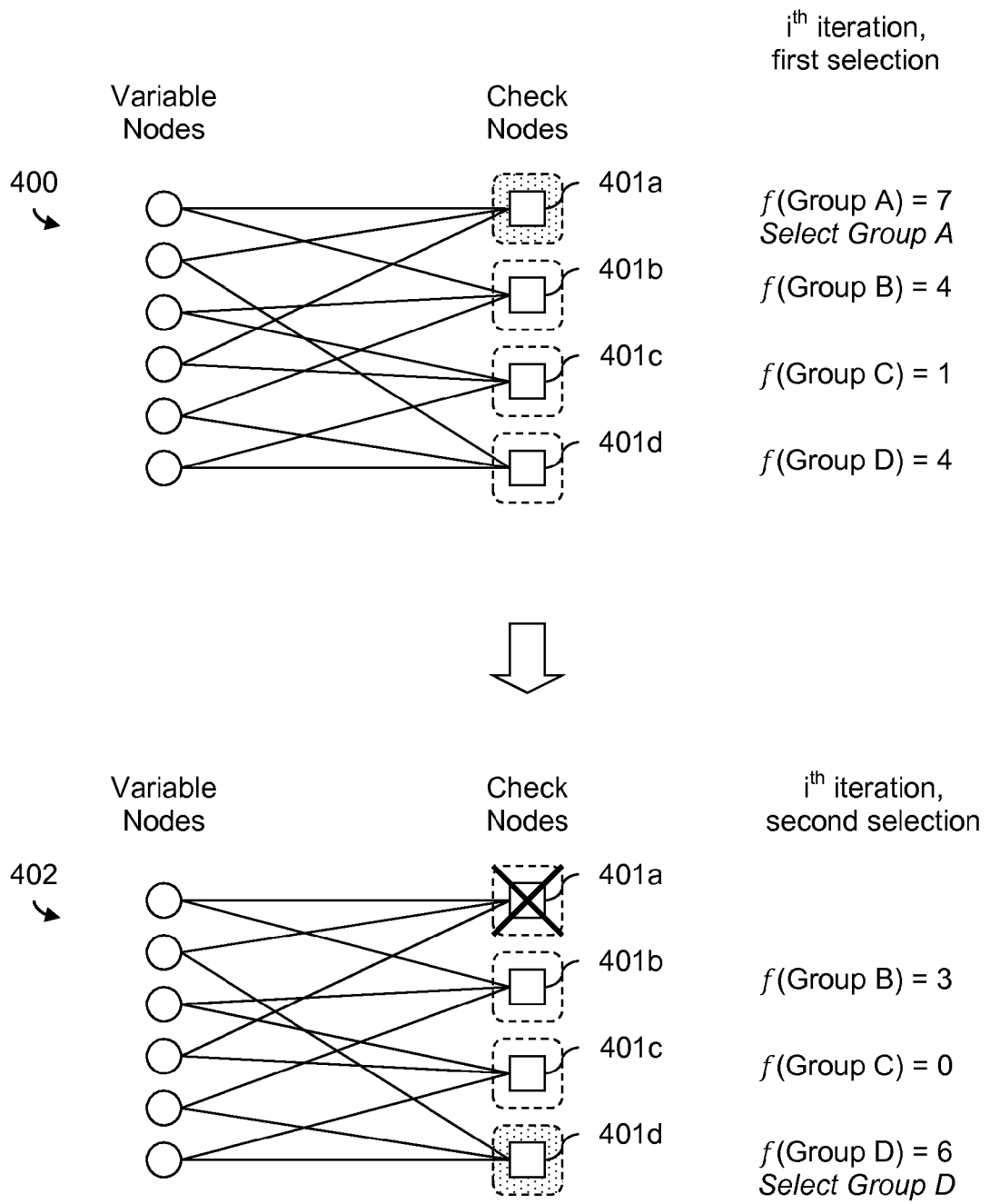
FIGS. 4 and 5 show an embodiment of a group of check nodes that are processed in a selective order based on a cost function.
Figure 5:
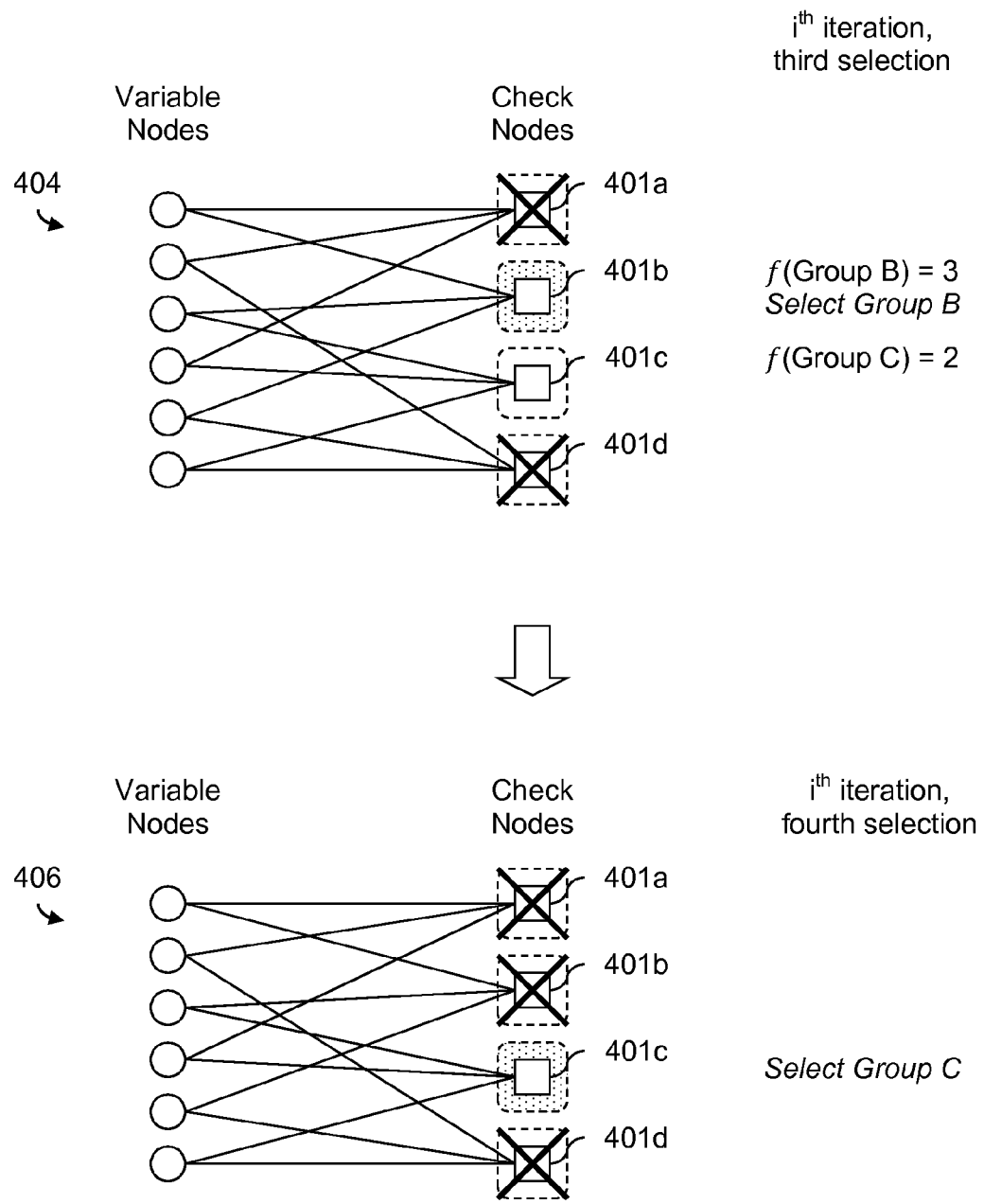

FIGS. 4 and 5 show an embodiment of a group of check nodes that are processed in a selective order based on a cost function. In diagram 400, the example process of FIG. 1 is used to select group of check nodes 401a based on the evaluation of a cost function for groups 401a-401d. In this example, the evaluated cost functions for Groups A-D are (respectively) 7, 4, 1, and 4, and (at least in this example) the group with the highest evaluated cost function is selected (i.e., Group A).

After selecting group 401a in diagram 400 and performing processing on data associated with that group, error correction processing is not completed (e.g., because one or more parity checks are not satisfied). See, for example, step 300 in FIG. 3. A next group is then selected in diagram 402. Since a group of check nodes can only be selected at most once during a given iteration, group 401a is not eligible to be selected at the point in time shown in diagram 402. In some embodiments, a cost function is not evaluated for non-eligible groups since they are not eligible to be selected.

The cost function is evaluated for a second time, and at least in this example the evaluated cost functions for each group are different in diagrams 400 and 402. In diagram 402, the evaluated cost functions for Groups B-D are 3, 0, and 6, respectively. Group D is selected since it has the highest evaluated cost function.

Error correction processing is not done (e.g., one or more parity checks are still not satisfied), and in diagram 404 the cost function is evaluated again in FIG. 5. Group B is selected because it has a higher evaluated cost function (3) compared to Group C (2). In diagram 406, only Group C remains since all other groups (i.e., Groups A, B, and D) have been selected. In some embodiments, the cost function is not evaluated when only one group of check nodes remains or is otherwise eligible.

Figure 6A:
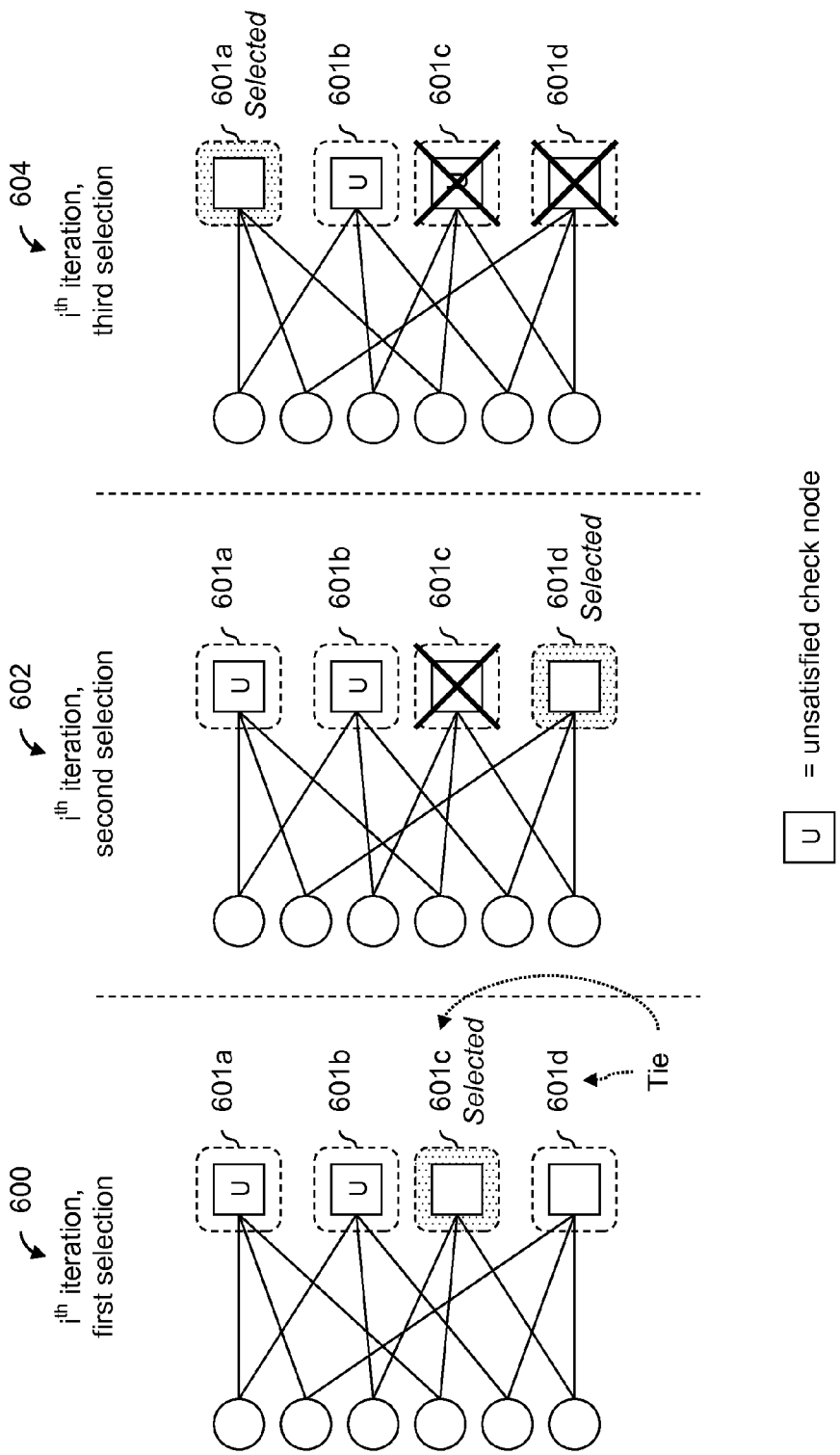
FIGS. 6A and 6B show an embodiment that uses a cost function that takes as input information associated with a check node.
Figure 6B:
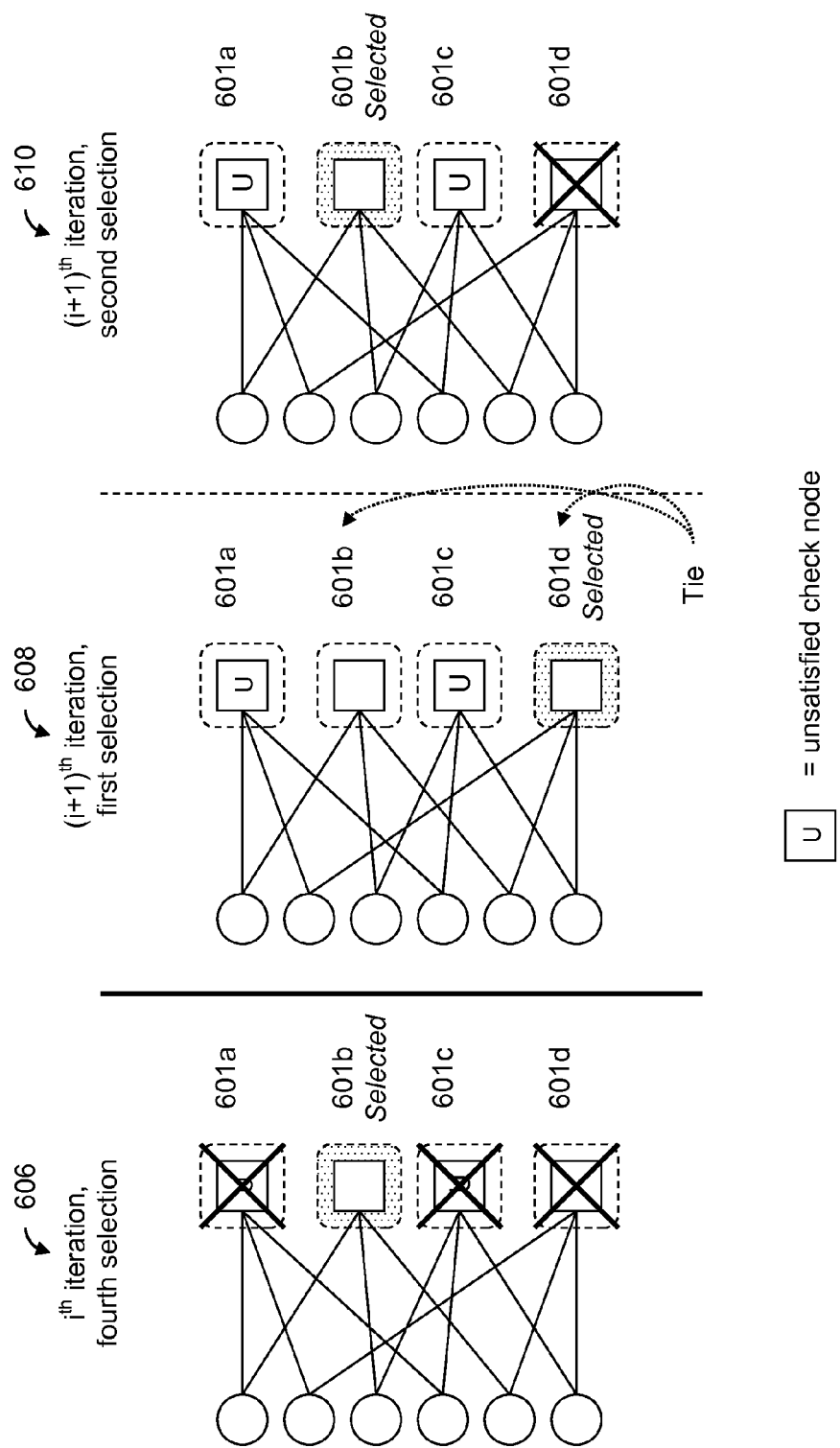

FIGS. 6A and 6B show an embodiment that uses a cost function that takes as input information associated with a check node. In the example shown, the group of check nodes with the least number of unsatisfied check nodes is selected. In some embodiments, this technique is used in applications or environments where there is a relatively low signal-to-noise ratio (SNR).

Diagram 600 shows a first selection of the $i^{th}$ iteration. In this example, unsatisfied check nodes (e.g., a parity check associated with that check node is not passing) are indicated with a "U". Groups 601c and 601d have the least number of unsatisfied check nodes (i.e., 0 unsatisfied check nodes), and there is a tie between them. Group 601c is selected in this example. The second selection of the iteration (e.g., after processing of data associated with selected group 601c is completed) is shown in diagram 602. In diagram 602, group 601d has the least number of unsatisfied check nodes and is selected.

The third selection of the $i^{th}$ iteration is shown in diagram 604. During that selection, groups 601a and 601b have not been selected yet in the ith iteration, and group 601a is selected since the check node in group 601b is an unsatisfied check node.

FIG. 6B includes diagram 606 which shows the fourth selection of the $i^{th}$ iteration. Group 601b is the only group remaining and is selected. A new iteration starts in diagram 608. In diagram 608, groups 601b and 601d are tied (based strictly on number of unsatisfied check nodes) since both have the least number of unsatisfied check nodes. So group 601d is selected arbitrarily, at least in this example. In some embodiments, group 601d is the only eligible selection because of the constraint (e.g., in the cost function) that no consecutive processing is performed on the same group of check nodes. In the second selection of the $(i+1)^{th}$ iteration shown diagram 610, groups 601a-601c have not been selected yet in the (i+1)th iteration, and group 601b is selected because it has the least number of unsatisfied check nodes.

Figure 7:
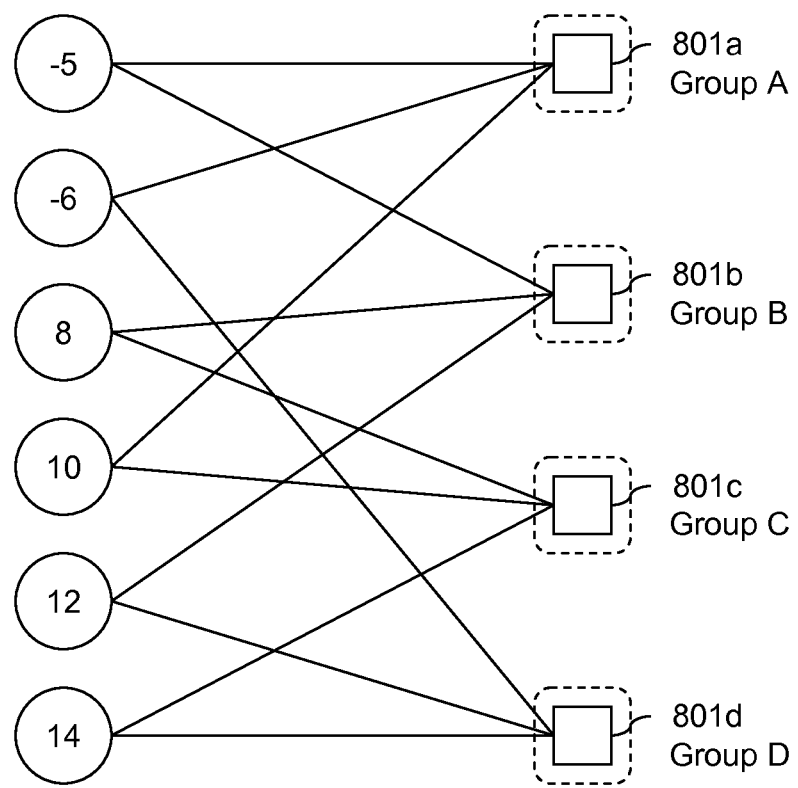
FIG. 7 is a diagram showing an embodiment of reliability values associated with variable nodes.

FIG. 7 is a diagram showing an embodiment of reliability values associated with variable nodes. In some embodiments, information associated with a variable node (such as a reliability value) is used to evaluate a cost function used to select a group of check nodes. Some examples are described in further detail below. In the examples described below, a reliability value can be a positive value or a negative value, and the example processes below use the absolute value (e.g., magnitude or amplitude) of the reliability values.

In a first example, an average of the reliability values is determined first for all groups, and then the group with the largest average is selected. Using the reliability values shown in FIG. 7, an example of this is shown below. In this example, there is a tie between Group C (801c) and Group D (801d). In this example (and in other embodiments) any tie-breaker can be employed including (for example) randomly selecting one of the groups, selecting a default group (e.g., first/last group), selecting the group that has gone the longest since it was last selected, etc.

TABLE 3

An example of selecting a group with the largest average reliability

| | Reliability values for associated variable nodes (absolute value) | Average of reliability values |
|---|---|---|
| Group A | 5, 6, and 10 | 7 |
| Group B | 5, 8, and 12 | 8⅓ |
| Group C | 8, 10, and 14 | 10⅔ (Tie for largest average; pick Group C or Group D) |
| Group D | 6, 12, and 14 | 10⅔ (Tie for largest average; pick Group C or Group D) |

In a second example, the group with the least number of reliability values below a (e.g., preset) threshold is selected. The table below shows an example using the data shown in FIG. 7 and a threshold of 7. Group C (801c) is selected using this technique and with the example reliability values.

TABLE 4

An example of selecting a group with the least
number of reliabilities below a threshold

| | Reliability values for associated variable nodes (absolute value) | Number of reliabilities below threshold of 7 |
|---|---|---|
| Group A | 5, 6, and 10 | 2 |
| Group B | 5, 8, and 12 | 1 |
| Group C | 8, 10, and 14 | 0 (Least number of reliabilities below 7; pick Group C) |
| Group D | 6, 12, and 14 | 1 |

In a third example, the group with the largest of the smallest reliabilities is selected. That is, first, the smallest reliability value for each group is selected and then the group with largest of those values is selected. The table below shows an example using the reliability values from FIG. 7. Group C (801*c*) is selected using this technique and with the example reliability values.

TABLE 5

An example of selecting a group with the
largest of smallest reliability values

| | Reliability values for associated variable nodes (absolute value) | Smallest of reliability values |
|---|---|---|
| Group A | 5, 6, and 10 | 5 |
| Group B | 5, 8, and 12 | 5 |
| Group C | 8, 10, and 14 | 8 (Largest of smallest values; select Group C) |
| Group D | 6, 12, and 14 | 6 |

In some embodiments, the three techniques shown above in Tables 3-5 are used in applications or cases where a SNR is relatively low. In some such low SNR environments, many small errors exist, and the techniques described above are directed towards spreading more reliable data or information earlier than "bad" data or information.

In various embodiments, the examples above can be modified. For example, in a modification of the first example, the group with the smallest average reliability values is selected. In another example, the group having the most number of variable nodes with a reliability value below a present threshold is selected. In yet another example, for each group the smallest reliability value is selected, then the group having the smallest of those reliability values is selected (i.e., smallest of smallest reliability values). In another example, the group having the most number of unsatisfied check nodes is selected. In some embodiments, the examples described above are used when SNR is relatively high such that only a very small number of errors exist. Therefore, there is a higher chance to select a group of check nodes which the error variable nodes are associated with and can be corrected.

Figure 8:
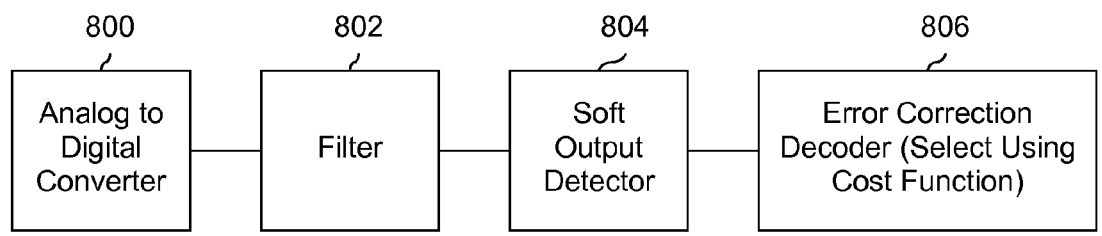
FIG. 8 is a diagram showing an embodiment of a disk drive system that includes an error correction decoder configured to use a cost function to select a group of check nodes.

FIG. 8 is a diagram showing an embodiment of a disk drive system that includes an error correction decoder configured to use a cost function to select a group of check nodes. For clarity, some components may not necessarily be shown. In the example shown, encoded data (e.g., encoded using an LDPC code) is stored on one or more disks (not shown). Analog data is passed to analog to digital converter (ADC) 800, and digital data is passed from ADC 800 to filter 802. The filtered data is passed to soft output detector 804 which in turn is coupled to error correction decoder 806. Error correction decoder 806 is configured to select a group of check nodes based on a cost function and process data associated with the selected group.

In this figure, a storage application is shown. In some other embodiments, an error correction decoder configured to select a group of check nodes using a cost function is included in some other system or is used in some other application or environment besides storage.

Figure 9:
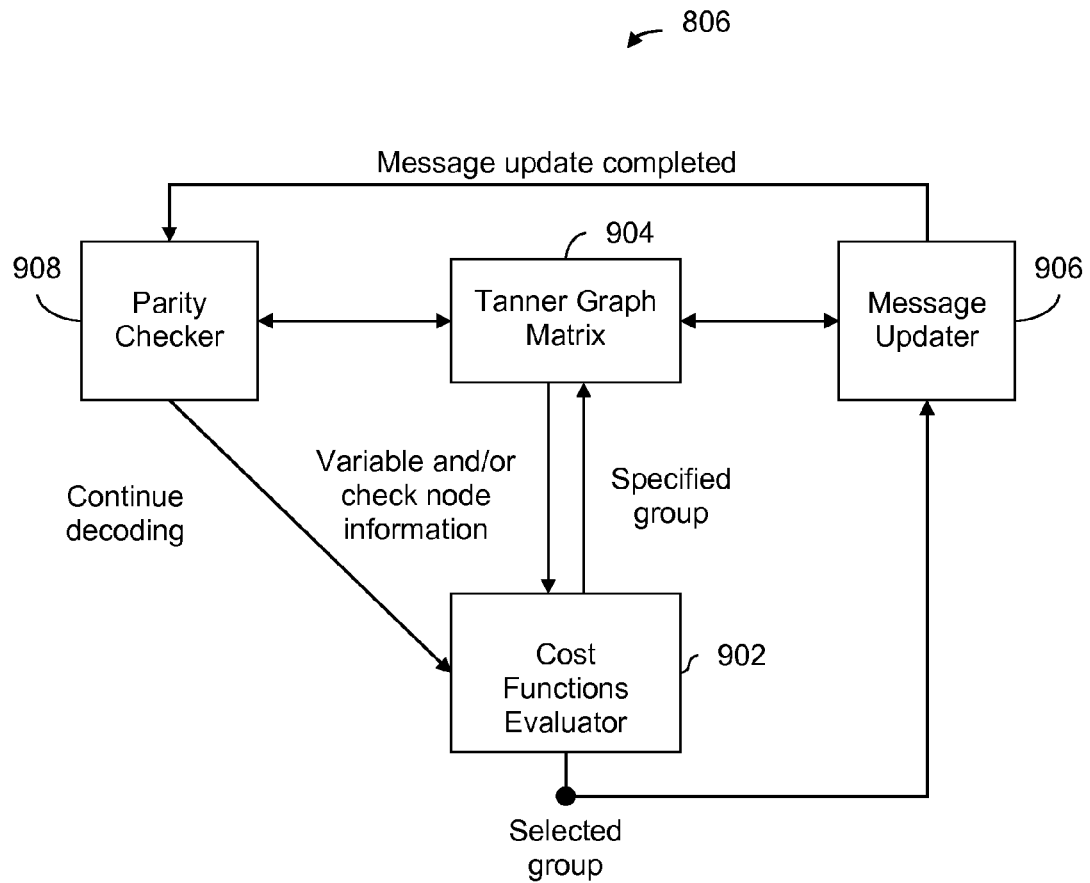
FIG. 9 is a diagram showing an embodiment of a system configured to select a group of check nodes based on a cost function.

FIG. 9 is a diagram showing an embodiment of a system configured to select a group of check nodes based on a cost function. In some embodiments, error correction decoder 806 from FIG. 8 includes the system shown. In various embodiments, the system shown in this figure is configured using any appropriate components. For example, in some embodiments a general purpose processor is configured to perform the functions described herein.

In the example shown, cost function evaluator 902 obtains the pertinent variable and/or check node information from Tanner Graph matrix 904; this information is used to evaluate a cost function. In this particular example, cost function evaluator 902 specifies a group to Tanner Graph matrix 904, and related variable node and/or check node information is passed from Tanner Graph matrix 904. Tanner Graph matrix 904 stores the connections between variable nodes and check nodes; the particular connections will depend upon the particular LDPC code used. Tanner Graph matrix 904 also stores information related to the variable nodes and check nodes, for example, related to which check nodes are unsatisfied (e.g., based on a parity check) and/or reliability values associated with the variable nodes.

In various embodiments, various cost functions are used, and the particular information obtained will vary depending upon the particular cost function. In some embodiments, cost function evaluator 902 is configurable. For example, it may include an interface configured to receive or otherwise obtain a cost function. In some embodiments, the particular information obtained from Tanner Graph matrix 904 will vary depending upon the particular cost function programmed into or otherwise provided to cost function evaluator 902.

After evaluating the cost function for all the groups (if appropriate), one of the groups is selected and is output by cost function evaluator 902 as the selected group. In some embodiments, cost function evaluator 902 is configured to not evaluate the cost function if there is only a single remaining group. For example, if there is one group and it is the first selection of an iteration, that group is selected without evaluating the cost function. That is, flooding schedule is a special case.

The selected group is passed from cost function evaluator 902 to message updater 906. Message updater 906 performs processing related to error correction decoding on data associated with the selected group. For example, message updater 906 may perform check node updates and/or variable node updates on data stored in Tanner Graph matrix 904 related to the selected group.

After updating information stored in Tanner Graph matrix 904, message updater 906 send a "message update completed" signal to parity checker 908. Parity checker 908 determines if error correction decoding is completed by checking if all parity checks are satisfied using information stored in Tanner Graph matrix 904. If error correction is not completed, parity checker 908 sends a "continue decoding" signal to cost functions evaluator 902 and the next group is selected.

Figure 10:
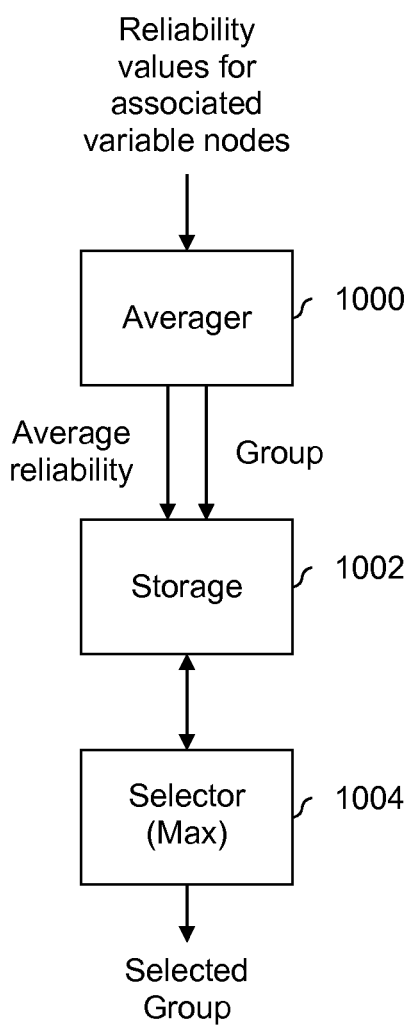
FIG. 10 is a diagram showing an embodiment of a cost function evaluator configured to evaluate a cost function and select a group of check nodes based on the evaluation(s).

FIG. 10 is a diagram showing an embodiment of a cost function evaluator configured to evaluate a cost function and select a group of check nodes based on the evaluation(s). In some embodiments, cost function evaluator 902 in FIG. 9 is implemented as shown. In this particular example, the cost function takes as an input reliability values for associated variable nodes. For other cost functions, functions performed by and/or information input to a corresponding cost function evaluator are different than the example shown.

For each check node in the given group, the reliability values of variable nodes that are connected to that check node are obtained. An average of the reliability values is determined for each check node in the given group by averager 1000. The average along with its corresponding group is passed from averager 1000 to storage 1002 where the information is stored. After averager 1000 determines and stores the average for each check node in the selected group in storage 1002, selector 1004 accesses the stored averages and selects the group with the largest stored average; that group is output as the selected group. In some cases, there is a tie and selector 1004 is configured to perform tie breaking For example, a random group can be selected from the tied groups, the tied group that has not been selected for the longest period of time, or a default group (e.g., first/last tied group in some order) is selected.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for processing data, comprising:
obtaining a cost function;
evaluating, for each of a plurality of groups of check nodes associated with low-density parity-check (LDPC) encoded data, the cost function, including by:
obtaining, for a given group of check nodes, one or more reliability values associated with the given group of check nodes, wherein the one or more reliability values include sign and magnitude; and
counting how many of the one or more reliability values have a magnitude which is less than a threshold, wherein the evaluated cost function for the given group of check nodes is based at least in part on the count;
selecting one of the groups of check nodes based at least in part on the evaluated cost functions; and
using a processor to perform error correction decoding related processing on the selected group of check nodes.

2. The method of claim 1, wherein performing processing includes determining a first outgoing message to a variable node connected to a first check node in the selected group based at least in part on one or more incoming messages from one or more other variable nodes connected to the first check node in the selected group.

3. The method of claim 2, wherein performing processing further includes determining a second outgoing message to a second check node connected to the variable node which is connected to the first check node based at least in part on one or more incoming messages from one or more other check nodes connected to the variable node which is connected to the first check node.

4. The method of claim 1, further comprising determining, after performing the processing, if error correction decoding is completed including by checking one or more parity checks.

5. The method of claim 1, wherein evaluating includes selecting for each of the plurality of groups a smallest reliability value associated with one or more variable nodes.

6. The method of claim 1, wherein selecting includes selecting a group of check nodes having a lowest count.

7. The method of claim 1, wherein selecting includes: in the event there is a tie, selecting a group of check nodes that has gone the longest since that group of check nodes was last selected.

8. The method of claim 1, wherein the threshold is half the magnitude of a reliability value having a largest magnitude.

9. A system for processing data, comprising:
an interface configured to obtain a cost function; and
a processor configured to:
evaluate, for each of a plurality of groups of check nodes associated with low-density parity-check (LDPC) encoded data, the cost function, including by:
obtaining, for a given group of check nodes, one or more reliability values associated with the given group of check nodes, wherein the one or more reliability values include sign and magnitude; and
counting how many of the one or more reliability values have a magnitude which is less than a threshold, wherein the evaluated cost function for the given group of check nodes is based at least in part on the count;
select one of the groups of check nodes based at least in part on the evaluated cost functions; and
perform error correction decoding related processing on the selected group of check nodes.

10. The system of claim 9, wherein the processor is configured to perform processing including by: determining a first outgoing message to a variable node connected to a first check node in the selected group based at least in part on one or more incoming messages from one or more other variable nodes connected to the first check node in the selected group.

11. The system of claim 10, wherein the processor is further configured to perform processing including by: determining a second outgoing message to a second check node connected to the variable node which is connected to the first check node based at least in part on one or more incoming messages from one or more other check nodes connected to the variable node which is connected to the first check node.

12. The system of claim 9, wherein the processor is further configured to determine, after performing the processing, if error correction decoding is completed including by: checking one or more parity checks.

13. The system of claim 9, wherein the processor is configured to evaluate including by: selecting for each of the plurality of groups a smallest reliability value associated with one or more variable nodes.

14. The system of claim 9, wherein the processor is configured to select by selecting a group of check nodes having a lowest count.

15. The system of claim 9, wherein the processor is configured to select by: in the event there is a tie, selecting a group of check nodes that has gone the longest since that group of check nodes was last selected.

16. The system of claim 9, wherein the threshold is half the magnitude of a reliability value having a largest magnitude.

17. A computer program product for processing data, the computer program product being embodied in a tangible, non-transitory computer readable storage medium and comprising computer instructions for:
obtaining a cost function;
evaluating, for each of a plurality of groups of check nodes associated with low-density parity-check (LDPC) encoded data, the cost function, including by:
obtaining, for a given group of check nodes, one or more reliability values associated with the given group of check nodes, wherein the one or more reliability values include sign and magnitude; and counting how many of the one or more reliability values have a magnitude which is less than a threshold, wherein the evaluated cost function for the given group of check nodes is based at least in part on the count;

selecting one of the groups of check nodes based at least in part on the evaluated cost functions; and performing error correction decoding related processing on the selected group of check nodes.

18. The computer program product of claim 17, wherein selecting includes selecting a group of check nodes having a lowest count.

19. The computer program product of claim 17, wherein selecting includes: in the event there is a tie, selecting a group of check nodes that has gone the longest since that group of check nodes was last selected.

20. The computer program product of claim 17, wherein the threshold is half the magnitude of a reliability value having a largest magnitude.

* * * * *